(12) United States Patent
Peck, Jr.

(10) Patent No.: US 9,389,619 B2
(45) Date of Patent: Jul. 12, 2016

(54) TRANSFORMER CORE FLUX CONTROL FOR POWER MANAGEMENT

(71) Applicant: THE BOEING COMPANY, Chicago, IL (US)

(72) Inventor: James Leo Peck, Jr., Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 334 days.

(21) Appl. No.: 13/953,314

(22) Filed: Jul. 29, 2013

(65) Prior Publication Data

US 2015/0028827 A1    Jan. 29, 2015

(51) Int. Cl.
*G01R 33/028* (2006.01)
*G05F 1/325* (2006.01)
*H01F 27/30* (2006.01)
*H01F 27/38* (2006.01)
*H01F 27/40* (2006.01)
*H01F 27/42* (2006.01)
*G01R 33/00* (2006.01)

(52) U.S. Cl.
CPC ............ *G05F 1/325* (2013.01); *G01R 33/0011* (2013.01); *H01F 27/306* (2013.01); *H01F 27/38* (2013.01); *H01F 27/402* (2013.01); *H01F 27/42* (2013.01)

(58) Field of Classification Search
CPC ...... G01R 15/185; G01R 33/02; G01R 1/203; G01R 33/04
USPC ......................................... 324/546, 547, 127
See application file for complete search history.

(56) References Cited

U.S. PATENT DOCUMENTS

| | | | |
|---|---|---|---|
| 352,105 | A | 11/1886 | Zipernowsky |
| 2,411,374 | A | 11/1946 | Horstman |
| 3,042,849 | A | 7/1962 | Dortort |
| 3,464,002 | A | 8/1969 | Hentschel |

(Continued)

FOREIGN PATENT DOCUMENTS

| | | |
|---|---|---|
| DE | 2926423 A1 | 1/1981 |
| DE | 4129265 A1 | 3/1993 |

(Continued)

OTHER PUBLICATIONS

European Patent Office, European Patent Application No. 14178702. 8, European Search Report dated Jan. 21, 2015, 7 pages.

(Continued)

*Primary Examiner* — Arleen M Vazquez
*Assistant Examiner* — Alesa Allgood
(74) *Attorney, Agent, or Firm* — Charles L. Moore; Moore & Van Allen PLLC

(57) ABSTRACT

An electromagnetic device may include a magnetic flux core and an opening through the magnetic flux core. A conductor winding may be received in the opening and extend through the magnetic flux core. An electrical current flowing through the conductor winding generates a magnetic field about the conductor winding and a magnetic flux flow about the opening in the magnetic flux core. The electromagnetic device may also include a core flux sensor arrangement to detect a magnetic flux level in the magnetic flux core. The electromagnetic device may additionally include a core flux control system configured to adjust the electrical current flowing through the conductor winding to control the magnetic flux level in the magnetic flux core.

17 Claims, 5 Drawing Sheets

(56) References Cited

U.S. PATENT DOCUMENTS

| | | | |
|---|---|---|---|
| 4,020,440 A | 4/1977 | Moerman | |
| 4,338,657 A | 7/1982 | Lisin | |
| 4,684,882 A | 8/1987 | Blain | |
| 4,897,626 A | 1/1990 | Fitter | |
| 5,351,017 A | 9/1994 | Yano | |
| 5,486,756 A * | 1/1996 | Kawakami | G01R 15/185 324/117 R |
| 5,534,831 A | 7/1996 | Yabuki | |
| 5,534,837 A | 7/1996 | Brandt | |
| 5,668,707 A | 9/1997 | Barrett | |
| 6,181,079 B1 | 1/2001 | Chang et al. | |
| 6,715,198 B2 | 4/2004 | Kawakami | |
| 7,106,047 B2 * | 9/2006 | Taniguchi | G01R 15/181 324/117 H |
| 7,342,477 B2 | 3/2008 | Brandt | |
| 7,362,206 B1 | 4/2008 | Herbert | |
| 7,378,828 B2 | 5/2008 | Brandt | |
| 7,639,520 B1 | 12/2009 | Zansky et al. | |
| 8,980,053 B2 | 3/2015 | Krahn et al. | |
| 9,106,125 B1 | 8/2015 | Brandt et al. | |
| 9,159,487 B2 | 10/2015 | Peck | |
| 2002/0163330 A1 * | 11/2002 | Sekiya | G01R 33/028 324/207.17 |
| 2003/0117251 A1 | 6/2003 | Haugs et al. | |
| 2004/0027121 A1 | 2/2004 | Choi et al. | |
| 2004/0051617 A1 | 3/2004 | Buswell | |
| 2004/0124958 A1 | 7/2004 | Watts | |
| 2006/0082430 A1 | 4/2006 | Sutardja | |
| 2006/0197480 A1 | 9/2006 | Mori et al. | |
| 2008/0150664 A1 | 6/2008 | Blankenship | |
| 2008/0163475 A1 | 7/2008 | Snyder | |
| 2009/0244937 A1 | 10/2009 | Liu | |
| 2010/0134058 A1 | 6/2010 | Nagashima et al. | |
| 2010/0194373 A1 * | 8/2010 | Hamberger | H01F 27/34 323/356 |
| 2011/0095858 A1 | 4/2011 | Spurny | |
| 2011/0210722 A1 | 9/2011 | Paci et al. | |
| 2012/0150679 A1 | 6/2012 | Lazaris | |
| 2012/0226386 A1 | 9/2012 | Kulathu et al. | |
| 2013/0043725 A1 | 2/2013 | Birkelund | |
| 2013/0049751 A1 | 2/2013 | Hamberger | |
| 2014/0022040 A1 | 1/2014 | Peck | |
| 2014/0210585 A1 | 7/2014 | Peck, Jr. | |
| 2014/0232384 A1 * | 8/2014 | Peck, Jr. | G01R 33/04 324/244 |
| 2015/0043119 A1 * | 2/2015 | Peck, Jr. | H02H 9/02 361/93.6 |

FOREIGN PATENT DOCUMENTS

| | | |
|---|---|---|
| EP | 1345036 A2 | 9/2003 |
| EP | 2688076 A2 | 1/2014 |
| JP | H01242333 A | 9/1989 |
| JP | H0977452 A | 3/1997 |
| WO | 2007078403 A2 | 7/2007 |
| WO | WO 2014130122 A1 | 8/2014 |

OTHER PUBLICATIONS

European Patent Office; International Search Report and Written Opinion for International Application No. PCT/US2013/072789 dated May 27, 2014, 12 Pages.

International Bureau of WIPO; International Preliminary Report on Patentability for International Application No. PCT/US2013/072789 dated Aug. 25, 2015, 9 Pages.

Wilson, Earl J.; "Strain-Gage Instrumentation," Harris' Shock and Vibration Handbook, 2002, pp. 17.1-17.15, Chapter 17, 5th Edition.

Chee, Clinton Y.K., et al.; "A Review on the Modelling of Piezoelectric Sensors and Actuators Incorporated in Intelligent Structures," Journal of Intelligent Material Systems and Structures, 1998, pp. 3-19, vol. 9.

Simoes Moita, Jose M., et al.; "Active control of adaptive laminated structures with bonded piezoelectric sensors and actuators," Computers and Structures, 2004, pp. 1349-1358, vol. 82.

Fedder, Gary K., et al.; "Laminated High-Aspect-Ratio Microstructures in a Conventional CMOS Process," Proceedings of the IEEE Micro Electro Mechanical Systems Workshop, 1996, pp. 13-18.

European Patent Office; Extended European Search Report for European Patent Application No. 14179801.7 dated Jul. 10, 2015, 14 Pages.

* cited by examiner

TRANSFORMER CORE FLUX CONTROL FOR POWER MANAGEMENT

FIELD

The present disclosure relates to electromagnetic devices, such as electrical transformers and inductors, and more particularly to controlling the magnetic flux in a core of an electromagnetic device for power management.

BACKGROUND

Electromagnetic devices, such as inductors, transformers and similar devices include magnetic cores in which a magnetic flux flow may be generated in response to an electrical current flowing through a conductor winding associated with the magnetic core. As current (AC) in the magnetic core increases, the inductance in the core increases (energy storage in the device increases). In a transformer configuration which includes a primary winding connected to an electrical power source and a secondary winding connected to a load, changes in the current or voltage supplied by the electrical power source can significantly change the energy being stored in the magnetic core for transfer into the secondary. For example a lightning strike on the primary winding of the transformer can result in extremely high voltage and current levels transferred to the secondary which may potentially damaging to the load. Accordingly, there is a need to control a level of magnetic flux flow in the cores of transformers and other electromagnetic devices.

SUMMARY

In accordance with an embodiment, an electromagnetic device may include a magnetic flux core and an opening through the magnetic flux core. A conductor winding is received in the opening and extends through the magnetic flux core. An electrical current flowing through the conductor winding generates a magnetic field about the conductor winding and a magnetic flux flow about the opening in the magnetic flux core. The electromagnetic device may also include a core flux sensor arrangement to detect a magnetic flux level in the magnetic flux core. The electromagnetic device may additionally include a core flux control system configured to adjust the electrical current flowing through the conductor winding to control the magnetic flux level in the magnetic flux core.

In accordance with another embodiment, an electromagnetic device may include a flux sensor core portion and at least one elongated opening through the flux sensor core portion. A conductor winding may be received in the at least one elongated opening and extend through the flux sensor core portion. An electrical current flowing through the conductor winding generates a magnetic field about the conductor winding and a magnetic flux flow about the at least one elongated opening in the flux sensor core portion. A plurality of pairs of sensor holes may be positioned relative to the at least one elongated opening for preventing significant disruption of the magnetic flux flow in the sensor core portion and for use in sensing a magnetic flux level at different distances from an edge of the at least one elongated opening. The electromagnetic device may also include a sensor conductor winding through each pair of sensor holes. The magnetic flux flow generates an electrical signal in each sensor conductor winding. The electrical signal in a particular sensor conductor winding corresponds to the magnetic flux level at a location of the particular sensor conductor winding. The electromagnetic device may additionally include a core flux sensor for detecting the magnetic flux level at the location of each sensor conductor winding. A spacer portion may be disposed on opposite sides of the flux sensor core. The spacer portion may include an opening and the conductor winding may pass through the spacer portion opening. A magnetic core portion may be disposed on each spacer portion. The at least one elongated opening extends through the magnetic core portion and the conductor winding extends through each magnetic core portion. The spacer portion may include a gap for the sensor conductor winding through each pair of sensor holes to connect to the core flux sensor for detecting the magnetic flux level at the location of each sensor conductor winding. The electromagnetic device may further include a core flux control system configured to adjust the electrical current flowing through the conductor winding to control the magnetic flux level in the magnetic flux core.

In accordance with further embodiment, a method for controlling a magnetic flux level of an electromagnetic device may include detecting a magnetic flux level in a magnetic flux core of the electromagnetic device. The method may also include adjusting an electrical source current flowing through a conductor winding that extends through an opening through the magnetic flux core of the electromagnetic device to control the magnetic flux level in the core. An amount or amplitude of electrical source current flowing through the conductor winding corresponds to the magnetic flux level.

BRIEF DESCRIPTION OF THE SEVERAL VIEWS OF DRAWINGS

The following detailed description of embodiments refers to the accompanying drawings, which illustrate specific embodiments of the disclosure. Other embodiments having different structures and operations do not depart from the scope of the present disclosure.

DESCRIPTION

Figure 1:
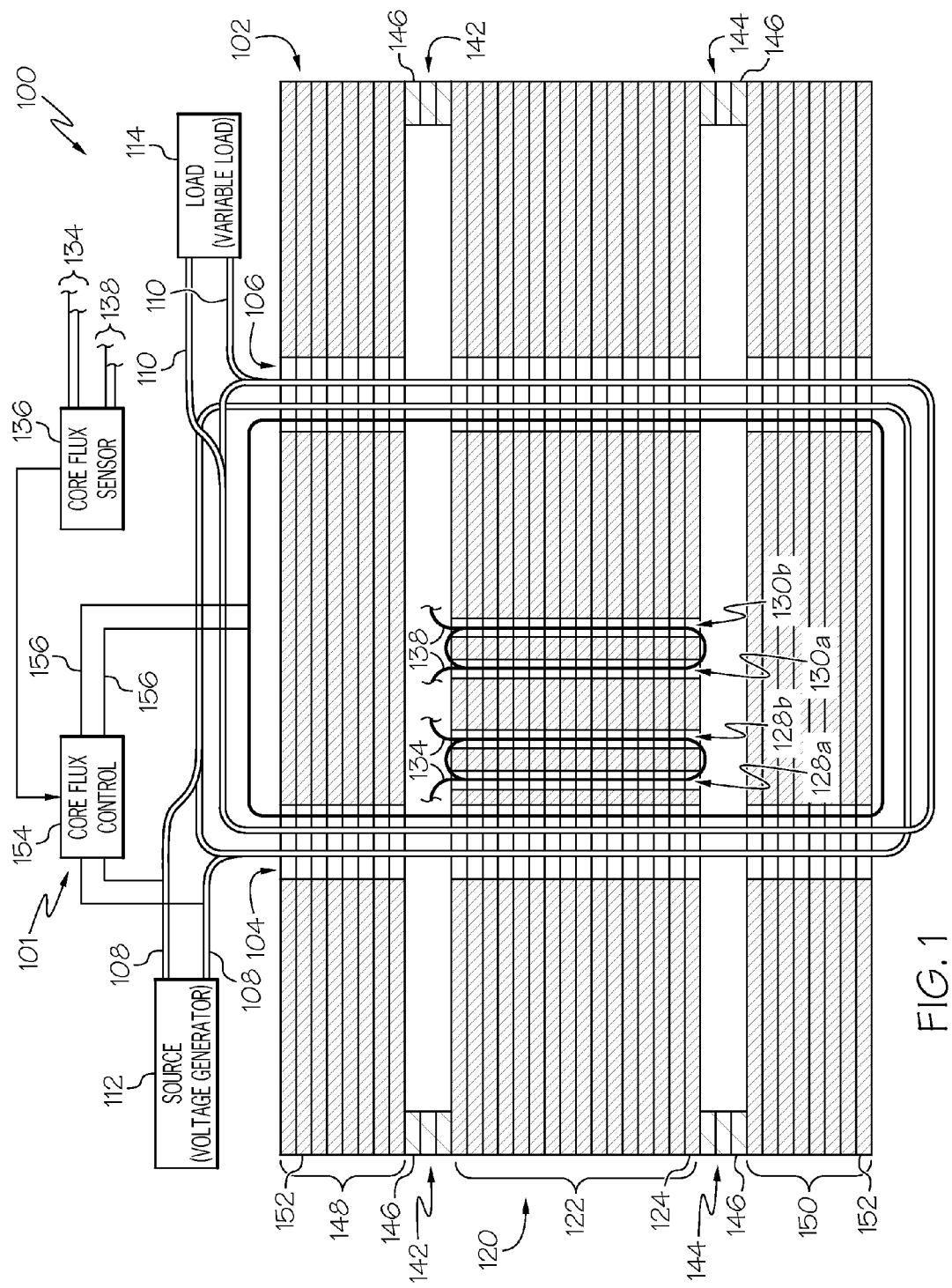
FIG. 1 is a side cross-sectional view of an example of an electromagnetic device and a core flux control system in accordance with an embodiment of the present disclosure.

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

In accordance with an embodiment of the present disclosure, a linear inductor is an electromagnetic device having only one electrical conductor wire winding or windings passing through a magnetic core. In accordance with another embodiment, a linear transformer is an electromagnetic device where a linear primary electrical conductor wire winding or windings and one or more linear secondary electrical conductor wire winding or windings pass through a magnetic core. The core may be one piece and no turns of the primary and secondary electrical conductors about the core are required. While the core may be one piece, the one piece core may be formed from a plurality of stacked plates or laminates. A current may be conducted through the primary. A magnetic flux from the current in the primary is absorbed by the core. When the current in the primary decreases the core transmits an electromotive force (desorbs) into the secondary wires. A feature of the linear transformer is the linear pass of the primary and secondary conductors through the core. One core may be used as a standalone device or a series of two or more cores may be used where a longer linear exposure is required. Another feature of this transformer is that the entire magnetic field or at least a substantial portion of the magnetic field generated by the current in the primary is absorbed by the core, and desorbed into the secondary. The core of the transformer may be sized or include dimensions so that substantially the entire magnetic field generated by the current is absorbed by the core and so that the magnetic flux is substantially completely contained with the core. This forms a highly efficient transformer with very low copper losses, high efficiency energy transfer, low thermal emission and very low radiated emissions. Additionally the linear transformer is a minimum of about 50% lower in volume and weight then existing configurations. Linear electromagnetic devices, such as linear transformers, inductors and similar devices are described in more detail in U.S. patent application Ser. No. 13/553,267, filed Jul. 19, 2012, entitled "Linear Electromagnetic Device" which is assigned to the same assignee as the present application and is incorporated herein in its entirety by reference. A magnetic core flux sensor assembly is described in more detail in U.S. patent application Ser. No. 13/773,135, filed Feb. 21, 2013, entitled "Magnetic Core Flux Sensor and is incorporated herein in its entirety by reference.

FIG. 1 is a cross-sectional view of an example of an electromagnetic device 100 and core flux control system 101 in accordance with an embodiment of the present disclosure. The electromagnetic device 100 may include a magnetic flux core 102. As described in more detail herein, the core flux control system 101 may be configured to adjust an electrical current flowing through a conductor winding to control a magnetic flux level in the magnetic flux core 102. A first opening 104 and a second opening 106 may be formed through the magnetic core 102. The first opening 104 and the second opening 106 may be elongated openings similar to that illustrated in FIGS. 2 and 4. The exemplary electromagnetic device 100 illustrated in FIG. 1 may be configured as a transformer and may include a primary conductor winding 108 and a secondary conductor winding 110. The primary conductor winding 108 may extend through the first opening 104 and the second opening 106 and may be coupled to a source 112 of electrical power. The source 112 may be a voltage generator. The secondary conductor winding 110 may also extend through the first opening 104 and the second opening 106 and maybe coupled to a load 114. The load 114 may be a variable load. An electrical current flowing through the primary conductor winding 108 generates a magnetic field around the primary conductor winding 108 and a magnetic flux flow is created in the magnetic core 102 as illustrated by arrows 116 and 118 in FIGS. 2 and 4. The magnetic flux flow in the magnetic core 102 will be in opposite directions about the respective elongated openings 104 and 106, as illustrated by arrows 116 and 118, because of the direction of electric current flow in the primary winding 108 (FIG. 1) through the elongated openings 104 and 106 and the right-hand rule. Based on the right-hand rule, electric current flowing into the page on FIG. 2 in windings 108 through elongated opening 104 will cause a magnetic flux flow in the direction of arrow 116 in the example in FIG. 2, and electric current flowing out of the page in the same windings 108 through elongated opening 106 will cause a magnetic flux flow in the direction of arrow 118.

While the exemplary electromagnetic device 100 illustrated in FIG. 1 has been described as having a first opening 104 and a second opening 106 through the magnetic flux core 102 and primary and secondary windings 108 and 110 through the openings 104 and 106, other embodiments may have a single opening. A primary conductor winding and a secondary conductor winding may extend through the single opening forming an electromagnetic device configured as a transformer. In another embodiment, a single conductor winding may extend through the single opening through the magnetic flux core. An electromagnetic device with a single conductor winding is configured as an inductor. The number and use of the windings determines whether the electromagnetic device is an inductor or transformer.

Figure 2:
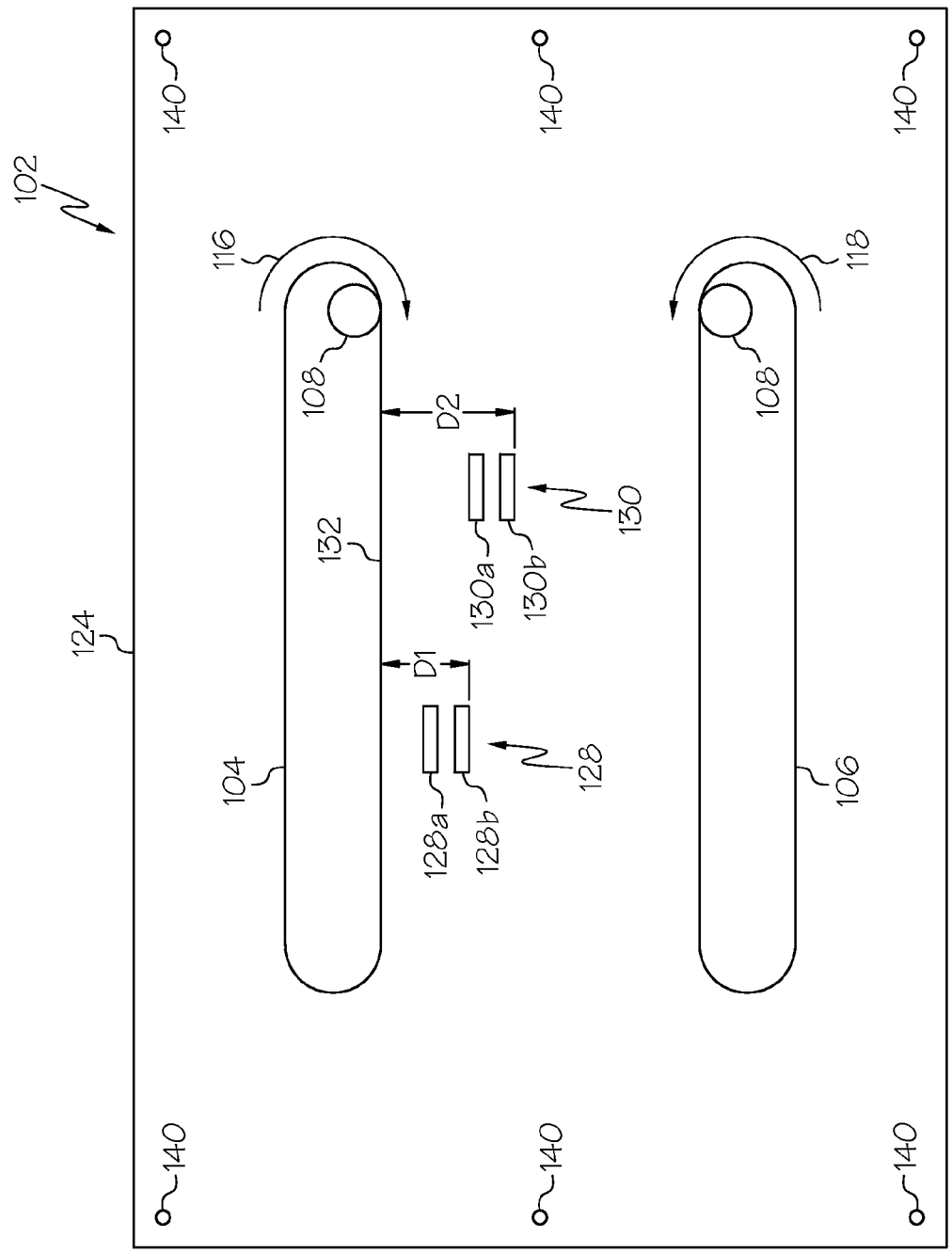
FIG. 2 is a top view of an example of a magnetic flux sensor plate or laminate in accordance with an embodiment of the present disclosure.

The electromagnetic device 100 may include a core flux sensor arrangement 120 to detect a magnetic flux level in the magnetic flux core 102. The magnetic flux core 102 of the electromagnetic device 100 may include a flux sensor core portion 122 that may be part of the core flux sensor arrangement 120. The flux sensor core portion 122 may include a plurality of flux sensor core plates 124 or laminates that are stacked on one another. Referring also to FIG. 2, FIG. 2 is a top view of an example of a magnetic flux sensor plate 124 or laminate in accordance with an embodiment of the present disclosure. Each sensor plate 124 of the flux sensor core portion 122 may include a first pair of sensor holes 128a and 128b and a second pair of sensor holes 130a and 130b for use in sensing a level of the magnetic flux flow 116 at a respective location of each of the first pair of sensor holes 128a and 128b and the second pair of sensor holes 130a and 130b. The first pair of sensor holes 128 and second pair of sensor holes 130 may be disposed along one longitudinal side or side with the longest dimension of the elongated opening 104. The first pair of sensor holes 128a and 128b may be a distance "D1" from an edge 132 of the opening 104 to the sensor hole 128b farthest from an edge 132 of the opening 104. The second pair of sensor holes 130a and 130b may be a distance "D2" from the edge 132 of the opening 104 to the sensor hole 130b farthest from the edge. The spacing between the sensor holes of each pair may be about half the distance "D1." The pairs of sensor holes 128 and 130 are positioned relative to the opening 104 through the magnetic flux core 102 for use in sensing the level of the magnetic flux flow 116 at different distances from the opening 104 while minimizing disruption of the magnetic flux flow 116 in the flux sensor core portion 122 of the magnetic flux core 102.

A sensor conductor winding 134 (FIG. 1) extending through the first pair of sensor holes 128a and 128b and connects to a core flux sensor device 136. A second sensor conductor winding 138 extends through the second pair of sensor holes 130a and 130b and connects to the core flux sensor device 136. The sensor holes 128 and 130 may be substantially elongate as illustrated in FIG. 2 for receiving the sensor windings 134 and 138 or the sensor holes 128 and 130 may be some other shape and size for receiving a particular shape and size of the sensor windings 134 and 138. The magnetic flux flow 116 generates an electrical signal in each of the sensor conductor winding 134 and 138. An amplitude of the electrical signal in each sensor conductor winding 134 and 138 corresponds to the level of the magnetic flux flow at the respective location of each sensor conductor winding 134 and 138 or sensor holes 128 and 130. The core flux sensor device 136 may be an oscilloscope or other device for detecting the magnetic flux flow and measuring the level of the magnetic flux flow in the core 102 at the respective location of the sensor holes 128 and 130 and sensor windings 134 and 138. The sensor windings 134 and 138 define loop antenna sensors as described in more detail below. The core flux sensor arrangement 120 may include the sensor holes 128, 130, the sensor windings 134 and 138 through the sensor holes 128 and 130 and the core flux sensor device 136.

While the exemplary electromagnetic device 100 illustrated in FIG. 1 has been described as having two pairs of sensor holes 128 and 130, other embodiments may have a single pair of sensor holes and a single sensor winding or more than two pairs of sensor holes and sensor windings for use in detecting or measuring a magnetic flux level at different locations in a magnetic flux core.

The sensor plates 124 may be made from a material capable of absorbing a magnetic flux. For example, the plates 124 may be made from silicon steel alloy, a nickel-iron alloy or other metallic material capable of absorbing a magnetic flux similar to that described herein. In an embodiment, the core 102 may be a nickel-iron alloy including about 20% by weight iron and about 80% by weight nickel. The plates 124 may be substantially square or rectangular, or may be some other geometric shape depending on the application of the electromagnetic device 100 and the environment where the electromagnetic device may be located.

In accordance with another embodiment, rather than a plurality of pairs of sensor holes 128 and 130, there may be a plurality of single sensor holes. Each sensor hole may be positioned relative to the at least one elongated opening 104 for preventing significant disruption of the magnetic flux flow in the sensor core portion 102 and for use in sensing the magnetic flux flow at different distances from the edge 132 of the at least one elongated opening 104. The sensor conductor winding may be a single wire or antenna element in each single sensor hole. The single sensor holes may be substantially circular or round or may be shaped to accommodate a size and shape of the single wire or antenna element.

Holes 140 may be formed in each of the flux sensor core plates 124 for receiving a fastener for assembling a plurality of sensor core plates 124 together in a stack as illustrated in FIG. 1.

Figure 3:
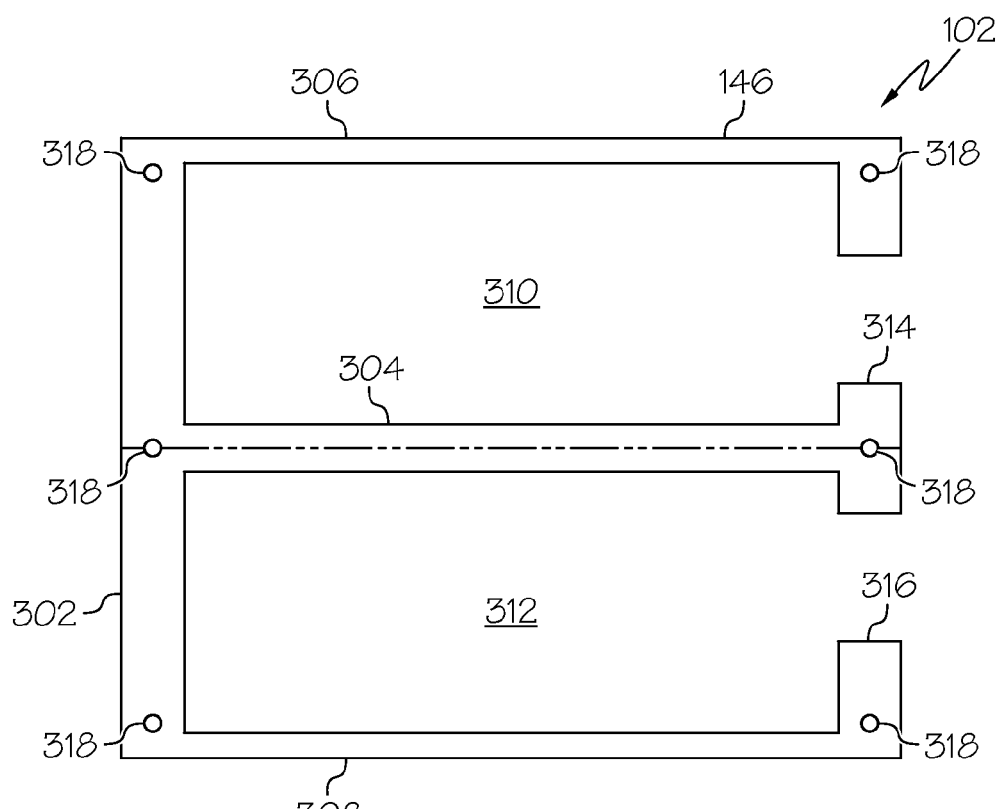
FIG. 3 is a top view of an example of a spacer plate or laminate in accordance with an embodiment of the present discloser.

The electromagnetic device 100 may also include a spacer portion 142 and 144 disposed on each outside flux sensor core plate 124. Each spacer portion 142 and 144 may include a plurality of spacer plates 146 stacked on one another. The spacer plates 146 may be made from a non-magnetic material or material that is an electrical insulator or dielectric. Referring also to FIG. 3, FIG. 3 is a top view of an example of a spacer plate 146 or laminate in accordance with an embodiment of the present disclosure. The spacer plate 146 may be substantially "E" shaped as illustrated in FIG. 3. The spacer plate 146 may include a main segment 302, a center segment 304 extending from a central portion of the main member 302 and two outer segments 306 and 308 extending from opposite ends of the main segment 302. A plurality of spacer plates 146 stacked to form the spacer portions 142 and 144 provide openings 310 and 312 formed between the two outer segments 306 and 308 and the center segment 304 as in the embodiment illustrated in FIG. 3. The primary conductor windings 108 and secondary conductor windings 110 pass or extend through the openings 310 and 312.

Each spacer plate 146 may also include a gap or gaps 314 and 316 for the sensor conductor windings 134 and 138 that pass through each pair of sensor holes 128 and 130 (FIGS. 1 and 2) to connect to the core flux sensor device 136 for detecting the magnetic flux level at the location of each sensor conductor winding 134 and 138 and associated pair of sensor holes 128 and 130. Each spacer plate 146 may also include holes 318 which will align with holes 140 in the flux sensor core plates 124 to receive holding devices or fasteners for holding the components of the electromagnetic device 100 together.

The electromagnetic device 100 also includes a magnetic core portions 148 and 150 respectively disposed on each spacer portion 142 and 144. The elongated openings 104 and 106 extend through each magnetic core portion 148 and 150 and the primary and secondary conductor windings 108 and 110 extend or pass through each magnetic core portion 148 and 150.

Figure 4:
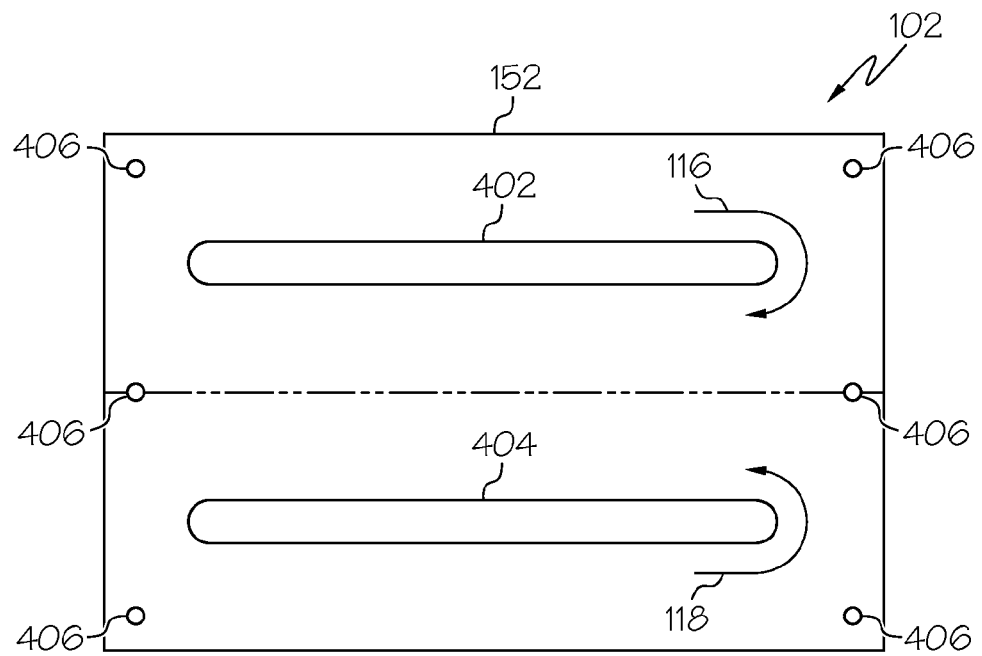
FIG. 4 is a top view of an example of a magnetic core plate or laminate in accordance with an embodiment of the present disclosure.

Each magnetic core portion 148 and 150 may include a plurality of magnetic core plates 152 or laminates stacked on one another as illustrated in the exemplary embodiment in FIG. 1. The plates 152 may be made from the same material as the sensor plates 124 that are capable of absorbing a magnetic flux as described herein. Referring also to FIG. 4, FIG. 4 is a top view of an example of a magnetic core plate 152 or laminate in accordance with an embodiment of the present disclosure. The magnetic core plate 152 includes a first elongated opening 402 which corresponds to opening 104 in FIG. 1 and a second elongated opening 404 which corresponds to opening 106. The second elongated opening 404 may be parallel to the first elongated opening 402 to permit the conductor winding or windings 108 and 110 to pass through the stacked magnetic core plates 152 forming the magnetic core portions 148 and 150. The openings 402 and 404 in each magnetic core plate 152 respectively form the openings 104 and 106 when the magnetic core plates or laminates are stacked together to form the magnetic core portions 148 and 150.

Each magnetic core plate 152 may also include a plurality of holes 406 which align with the openings 318 in the spacer plates 146 and openings 140 in the flux sensor core plates 124 for receiving a fastener or the like for assembling the magnetic flux core 102 of the electromagnetic device 100 (FIG. 1).

The core flux control system 101 (FIG. 1) may include a core flux control device 154. The core flux control device 154 may be configured to adjust the electrical current flowing through the primary conductor winding 108 to control the magnetic flux level in the magnetic flux core 102 of the electromagnetic device 100. The core flux control device 154 may be coupled to the primary winding 108 and may receive control input signals corresponding to the magnetic flux level from the core flux sensor device 136. The core flux control device 154 may adjust the electrical current flowing through the primary conductor winding 108 in response to the magnetic flux level detected or measured by the core flux sensor device 136. The core flux control device 154 may be adapted to adjust a number of turns in the primary conductor winding 108 so that a predetermined magnetic flux level may be maintained in the magnetic flux core 102. In accordance with an embodiment, the core flux control system 101 may include an additional winding or a control winding 156 or windings through the openings 104 and 106 of the magnetic core 102. The control winding 156 is coupled to the core flux control device 154. The core flux control device 154 may be adapted to connect the electrical power source 112 to the control winding 156 or windings and thereby adjust the number of turns of the primary winding 108. The core flux control device 154 in addition to being able to switch in or out the additional primary winding or control winding 156, may also control the amplitude or amount of current flowing in the control winding 156 to control the level of magnetic flux flow in the core 102.

The core flux sensor arrangement 120 may detect the magnetic flux level in the magnetic flux core 102 when a peak source current is flowing through the primary conductor winding 108. The core flux control device 154 may be adapted to increase the electrical current flow through the primary conductor winding 108 and/or control winding 156 in response to the magnetic flux level being lower than a predetermined level for the peak source current and to reduce the electrical current flowing through the primary conductor winding 108 and/or control winding 156 in response to the level of the magnetic flux flow being higher than the predetermined level for the peak current.

Figure 5:
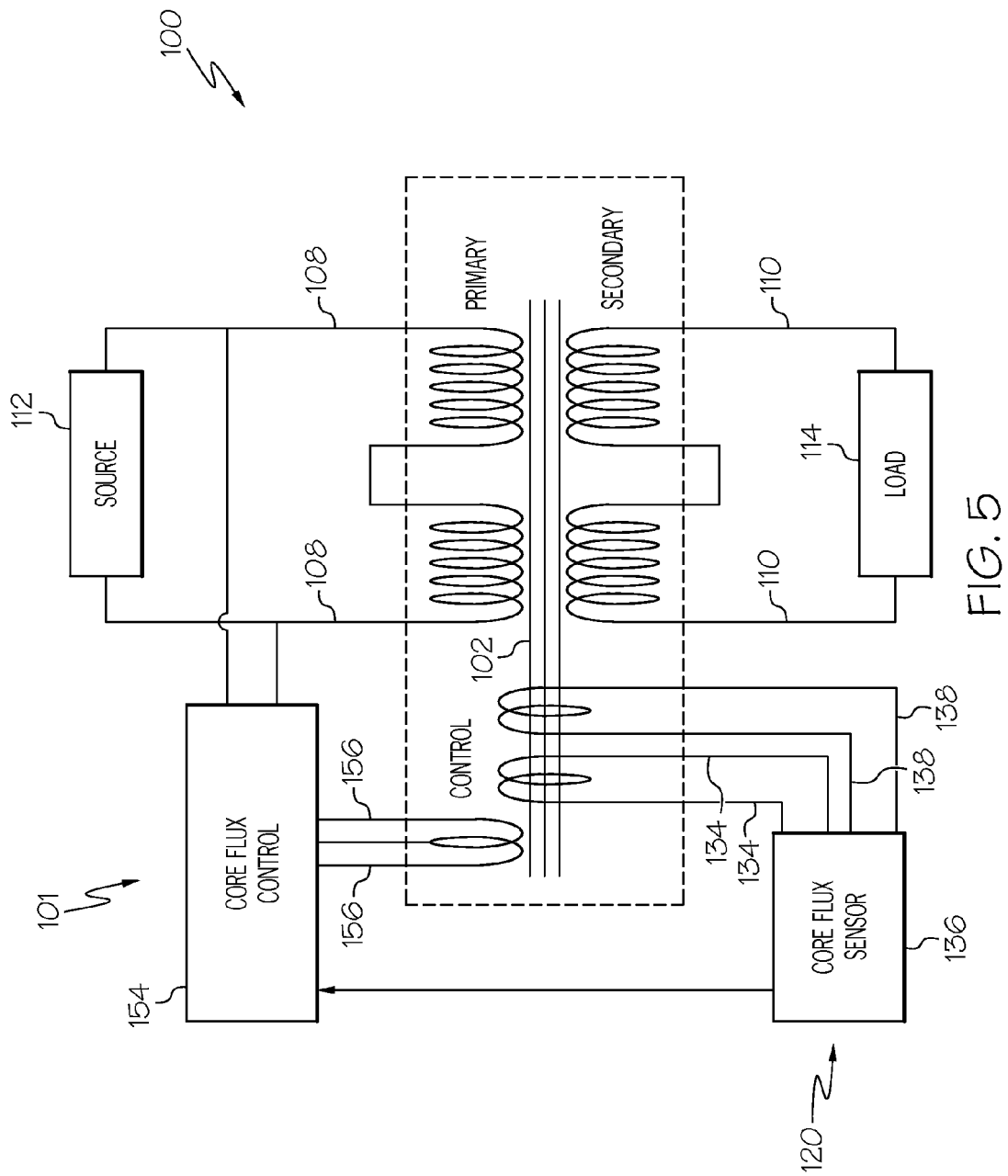
FIG. 5 is a block schematic diagram of the exemplary electromagnetic device and the core flux control system of FIG. 1.

FIG. 5 is a block schematic diagram of the exemplary electromagnetic device 100 and the core flux control system 101 of FIG. 1. As previously discussed, the core flux sensor device 136 detects the magnetic flux flow in the magnetic flux core 102 of the electromagnetic device 100 and measures a level of the magnetic flux flow in the magnetic flux core 102. The core flux sensor device 136 provides a signal corresponding to the magnetic flux level to the core flux control device 154. The core flux control device 154 is configured to adjust the electrical current flowing through the primary conductor winding 108 or windings to control the magnetic flux level in the magnetic flux core 102. The core flux control device 154 may be adapted to adjust a number of turns in the conductor winding by adding or subtracting turns to maintain a predetermined magnetic flux level in the magnetic flux core 102. For example, the core flux sensor 136 may detect the magnetic flux level in the magnetic flux core 102 when a peak source current is flowing through the primary conductor winding 108. The core flux control device 154 may increase the electrical current flow or increase an amplitude of the electrical current flowing through the primary conductor winding 108 in response to the magnetic flux level being lower than the predetermined level for the peak source current, and the core flux control device 154 may reduce the electrical current or reduce an amplitude of the current flowing through the conductor winding 108 in response to the level of the magnetic flux flow being higher than the predetermined level for the peak current.

As previously discussed, the core flux control device 154 may also be connected to an additional winding or control winding 156 or windings. In addition to controlling the amount or amplitude of current flowing in the primary conductor winding 108, the core flux control device 154 may also switch in or out the control winding 156 and may increase or decrease electrical current flowing in the control winding 156 to further control the magnetic flux level in the core 102.

Figure 6:
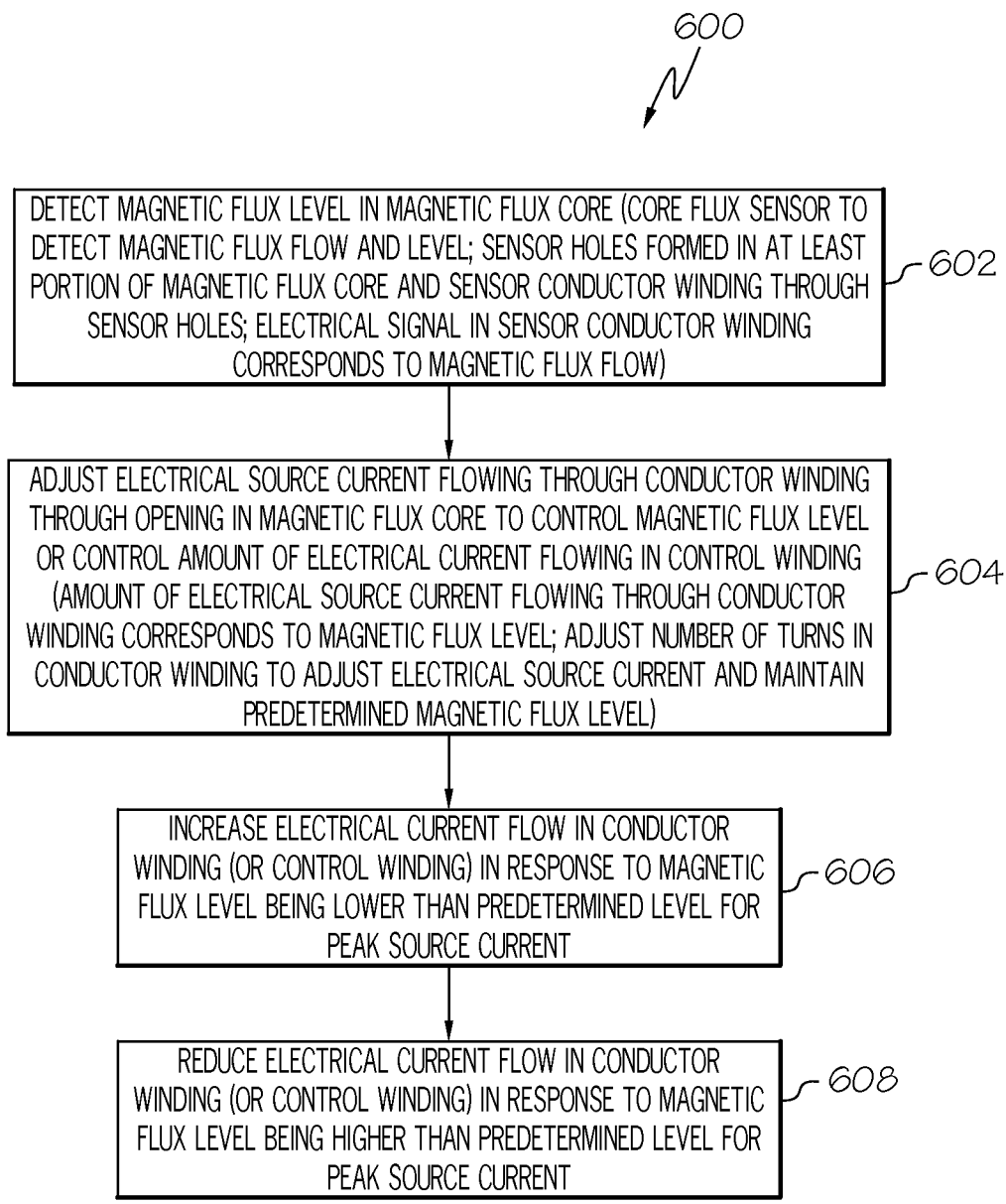
FIG. 6 is a flow chart of an example of a method for controlling magnetic flux in an electromagnetic device for power management in accordance with an embodiment of the present disclosure.

FIG. 6 is a flow chart of an example of a method 600 for controlling magnetic flux in an electromagnetic device for power management in accordance with an embodiment of the present disclosure. The method of 600 may be performed by the electromagnetic device 100 and the core flux control system 101 of FIG. 1 or a similar system. In block 602, a magnetic flux flow in a magnetic flux core may be detected and a level of the magnetic flux flow in the core measured. As previously described, a core flux sensor arrangement may detect the magnetic flux flow and level in the magnetic flux core. At least one pair of sensor holes may be formed in at least a portion of the magnetic core similar to that previously described and a sensor conductor winding may be passed through the at least one pair of sensor holes forming a loop sensor antenna for detecting the magnetic flux flow and level. The magnetic flux flow causes an electrical signal to be generated in the sensor conductor winding or loop antenna. An amplitude of the electrical signal corresponds to the magnetic flux level in the magnetic flux core.

In block 604, an electrical current flowing through a conductor winding passing through the magnetic flux core may be adjusted in response to the magnetic flux level detected or measured to control the magnetic flux level in the core. Alternatively or in addition, electrical current in a control winding may be adjusted in response to the magnetic flux level detected or measured in the core to control the flux flow level in the core by increasing or decreasing the current. The magnetic flux level may also be controlled or adjusted by adjusting the number of turns of the primary winding to maintain a predetermined magnetic flux level.

In block 606, electrical current flowing in a primary conductor winding or a control winding or both may be increased in response to the magnetic flux level being lower than a predetermined level for a peak source current.

In block 608, electrical current flowing in a primary conductor winding or a control winding or both may be reduced in response to the magnetic flux level being higher than the predetermined level or the peak source current.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the embodiments herein have other applications in other environments. This application is intended to cover any adaptations or variations of the present disclosure. The following claims are in no way intended to limit the scope of the disclosure to the specific embodiments described herein.

What is claimed is:

1. An electromagnetic device comprising: a magnetic flux core; an opening through the magnetic flux core; a conductor winding received in the opening and extending through the magnetic flux core, wherein an electrical current flowing through the conductor winding generates a magnetic field about the conductor winding and a magnetic flux flow about the opening in the magnetic flux core; a core flux sensor arrangement to detect a magnetic flux level in the magnetic flux core, the core flux sensor arrangement being formed within the magnetic flux core in a path of the magnetic flux flow; a core flux control system configured to adjust the electrical current flowing through the conductor winding to control the magnetic flux level in the magnetic flux core; and wherein the core flux sensor arrangement detects the magnetic flux level in the magnetic flux core when a peak source current is flowing through the conductor winding, the core flux control system being configured to increase the electrical current flowing through the conductor winding in response to the magnetic flux level being lower than a predetermined level for the peak source current and to reduce the electrical current flowing through the conductor winding in response to the magnetic flux flow being higher than the predetermined level for the peak current.

2. The electromagnetic device of claim 1, wherein the core flux control system is configured to adjust a number of turns in the conductor winding to maintain a predetermined magnetic flux level in the magnetic flux core.

3. The electromagnetic device of claim 1, wherein the core flux sensor arrangement comprises:
   a pair of sensor holes formed through at least a portion of the magnetic flux core, the pair of sensor holes being positioned relative to the opening through the magnetic flux core for use in sensing the magnetic flux flow while minimizing disruption of the magnetic flux flow in the magnetic flux core; and
   a sensor conductor winding through the pair of sensor holes, the magnetic flux flow generating a first electrical signal in the sensor conductor winding, the first electrical signal in the sensor conductor winding corresponding to the magnetic flux level at a location of the sensor conductor winding.

4. The electromagnetic device of claim 3, wherein the core flux sensor arrangement comprises:
   a second pair of sensor holes formed through at least the portion of the magnetic flux core at a greater distance from the opening than the pair of sensor holes, the second pair of sensor holes for use in sensing the magnetic flux flow at a location of the second pair of sensor holes; and
   a second sensor conductor winding through the second pair of sensor holes, the magnetic flux flow generating a second electrical signal in the second sensor conductor winding, the second electrical signal in the second sensor conductor winding corresponding to the magnetic flux level at the location of the second sensor conductor winding.

5. The electromagnetic device of claim 4, wherein each of the sensor holes is an elongated opening.

6. The electromagnetic device of claim 1, wherein the opening through the magnetic flux core is an elongated opening for receiving at least the conductor winding.

7. The electromagnetic device of claim 6, further comprising:
   a second elongated opening; and
   a secondary conductor winding, wherein the core flux control system adjusts the electrical current flowing through the conductor winding to control the magnetic flux level in the core and a power output of the secondary conductor winding based on the magnetic flux level in the core.

8. The electromagnetic device of claim 1, further comprising a control winding through at least a portion of the core, wherein the core flux control system increases or decreases electrical current flowing in the control winding to control the magnetic flux level in the core.

9. The electromagnetic device of claim 8, wherein the core flux sensor arrangement detects the magnetic flux level in the magnetic flux core when a peak source current is flowing through the conductor winding, the core flux control system being configured to increase the electrical current flowing through the control winding in response to the magnetic flux level being lower than a predetermined level for the peak source current and to reduce the electrical current flowing through the control winding in response to the magnetic flux flow being higher than the predetermined level for the peak current.

10. An electromagnetic device, comprising: a magnetic flux core; a flux sensor core portion of the magnetic flux core; at least one elongated opening through the flux sensor core portion; a conductor winding received in the at least one elongated opening and extending through the flux sensor core portion, wherein an electrical current flowing through the conductor winding generates a magnetic field about the conductor winding and a magnetic flux flow about the at least one elongated opening in the flux sensor core portion; a plurality of pairs of sensor holes formed within the flux sensor core portion and positioned relative to the at least one elongated opening for preventing significant disruption of the magnetic flux flow in the sensor core portion and for use in sensing the magnetic flux flow at different distances from an edge of the at least one elongated opening; a sensor conductor winding through each pair of sensor holes, the magnetic flux flow generating an electrical signal in each sensor conductor winding, the electrical signal in a particular sensor conductor winding corresponding to the magnetic flux flow at a location of the particular sensor conductor winding; a core flux sensor for detecting a magnetic flux level at the location of each sensor conductor winding; a spacer portion disposed on opposite sides of the flux sensor core portion, the spacer portion comprising an opening, the conductor winding passing through the spacer portion opening; a magnetic core portion of the magnetic flux core disposed on each spacer portion, wherein the at least one elongated opening extends through the magnetic core portion, the conductor winding extending through each magnetic core portion, and wherein the spacer portion comprises a gap for the sensor conductor winding through each pair of sensor holes to connect to the core flux sensor for detecting the magnetic flux flow at the location of each sensor conductor winding; and a core flux control system configured to adjust the electrical current flowing through the conductor winding to control the magnetic flux level in the magnetic flux core; and wherein the core flux sensor detects the magnetic flux level in the magnetic flux core when a peak source current is flowing through the conductor winding, the core flux control system being configured to increase the electrical current flowing through the conductor winding in response to the magnetic flux level being lower than a predetermined level for the peak source current and to reduce the electrical current flowing through the conductor winding in response to the magnetic flux flow being higher than the predetermined level for the peak current.

11. The electromagnetic device of claim 10, wherein the plurality of pairs of sensor holes comprise a first pair of sensor holes and a second pair of sensor holes at a spacing from one another along a longitudinal side of the at least one elongated opening and with the second pair of sensor holes being a greater distance from an edge of the longitudinal side of the at least one elongated opening than the first pair of sensor holes.

12. The electromagnetic device of claim 11, further comprising:
   a second elongated opening parallel to the at least one elongated opening through the flux sensor core portion and the magnetic core portion, the conductor winding passing through the second elongated opening, wherein the electrical current flowing through the conductor winding generates the magnetic field about the conductor winding and another magnetic flux flow about the second elongated opening in the flux sensor core portion and the magnetic core portion; and
   a second conductor winding passing through the second elongated opening, the at least one elongated opening and the spacer portion opening.

13. A method for controlling a magnetic flux flow in an electromagnetic device, comprising: detecting a magnetic flux level in a magnetic flux core of the electromagnetic device by a core flux sensor arrangement formed within the magnetic flux core in a path of the magnetic flux flow; and adjusting an electrical source current flowing through a conductor winding extending through an opening in the magnetic flux core of the electromagnetic device to control the magnetic flux level in the magnetic flux core, an amplitude of the electrical source current flowing through the conductor winding corresponds to the magnetic flux level; and detecting the magnetic flux core when a peak source current is flowing through the conductor winding; increasing the electrical current flowing through the conductor winding in response to the magnetic flux level being lower than a predetermined level for the peak source current; and reducing the electrical current flowing through the conductor winding in response to the magnetic flux level being higher than the predetermined level for the peak source current.

14. The method of claim 13, further comprising adjusting a number of turns in the conductor winding to adjust the electrical source current and maintain a predetermined magnetic flux level in the magnetic flux core.

15. The method of claim 13, further comprising:
providing a pair of sensor holes formed through at least a portion of the magnetic flux core, the pair of sensor holes being positioned relative to the opening through the magnetic flux core, the pair of sensor holes being used in sensing the magnetic flux level while minimizing disruption of the magnetic flux flow in the magnetic flux core; and
providing a sensor conductor winding through the pair of sensor holes, the magnetic flux flow generating an electrical signal in the sensor conductor winding, an amplitude of the electrical signal in the sensor conductor winding corresponding to the magnetic flux level at a location of the sensor conductor winding.

16. The method of claim 13, further comprising increasing or decreasing an amount of electrical current flowing in a control winding to control the magnetic flux level in the core.

17. The method of claim 16, further comprising:
increasing the amount of electrical current flowing in the control winding in response to the magnetic flux level being lower than a predetermined level for a peak source current flowing through the conductor winding; and
reducing the amount of electrical current flowing in the control winding in response to the magnetic flux level being higher than the predetermined level for the peak source current flowing through the conductor winding.

* * * * *